United States Patent [19]
Hong

[11] Patent Number: 5,427,968
[45] Date of Patent: Jun. 27, 1995

[54] SPLIT-GATE FLASH MEMORY CELL WITH SEPARATED AND SELF-ALIGNED TUNNELING REGIONS

[75] Inventor: Gary Hong, Hsin-Chu, Taiwan

[73] Assignee: United Microelectronics Corp., Hsinchu City, Taiwan

[21] Appl. No.: 269,536

[22] Filed: Jul. 1, 1994

Related U.S. Application Data

[62] Division of Ser. No. 226,998, Apr. 13, 1994.

[51] Int. Cl.$^6$ .......................................... H01L 21/8246
[52] U.S. Cl. ........................................ 437/43; 437/52;
            437/48; 148/DIG. 109
[58] Field of Search ............... 437/43, 49, 52, 48;
            148/DIG. 109

[56] References Cited

U.S. PATENT DOCUMENTS

| | | | |
|---|---|---|---|
| 5,019,879 | 5/1991 | Chiu | 437/43 |
| 5,268,319 | 12/1993 | Harari | 437/49 |
| 5,268,585 | 12/1993 | Yamauchi | 437/48 |
| 5,284,784 | 2/1994 | Manley | 437/43 |

FOREIGN PATENT DOCUMENTS 4076955 3/1992 Japan ..................... 257/315

*Primary Examiner*—Brian E. Hearn
*Assistant Examiner*—Tuan Nguyen
*Attorney, Agent, or Firm*—Ladas & Parry

[57] ABSTRACT

An electronically erasable and reprogrammable memory integrated circuit device having split-gate memory cell with separated tunneling regions and its process of fabrication are disclosed. A silicon substrate having field oxide layers isolating component regions are processed to construct a memory cell in each of the isolated component region. Each of the memory cells includes a drain and source region formed in the silicon substrate, with a channel formed between the drain and source regions. Ring-shaped floating gate surrounds and covers the periphery of the channel and is isolated with the drain and source regions respectively by two thin tunneling oxide layers that are separated from each other. The two separated tunneling oxide layers constitute two separated tunneling regions. A control gate layer covers the ring-shaped floating gate and the portion of the channel that is not covered by the floating gate layer, and is separated from the floating gate by an isolation layer. A gate oxide layer is formed between the control gate layer and channel.

20 Claims, 3 Drawing Sheets

SPLIT-GATE FLASH MEMORY CELL WITH SEPARATED AND SELF-ALIGNED TUNNELING REGIONS

This is a divisional of co-pending application Ser. No. 08/226,998 filed Apr. 13, 1994.

BACKGROUND OF THE INVENTION

1. Field of the Invention

This invention relates in general to flash memory integrated circuit devices. In particular, this invention relates to split-gate flash memory integrated circuit devices and even more particularly, this invention relates to split-gate flash memory cell with separated and self-aligned tunneling regions.

2. Technical Background

Electrically Erasable and Programmable Read-Only Memory (EEPROM) devices have been widely utilized in a variety of electronic equipment, including microcomputer systems. Conventional EEPROM devices have memory cells which comprise floating-gate transistors. Such devices are able to maintain information written into the memory cells in the absence of a power source for the device, and are further capable of having of the information stored in their memory cells erased. These memory devices, however, suffer from their relatively slow read/write access times, which are typically in the range of 150 to 200 nsec. EEPROM devices capable of operating at faster speeds (with 70 to 80 nsec access times) have been developed in the last several years. For example, Intel Corporation of Santa Clara, Calif., has introduced a series of fast EEPROM devices and refers them generically as "Flash Memories."

One of the problems Flash Memory devices suffer from is a problem of "over-erasure" of the memory cell contents during erasure operations. FIG. 1 depicts the construction of a conventional floating-gate transistor. As can be seen in FIG. 1, the floating-gate transistor comprises a floating gate 10 and a control gate 12, capable of injecting electrons from the drain 16, based on a phenomena known as the Fowler-Nordheim Tunneling Effect, through a tunneling oxide layer 14 into the floating gate 10. The threshold voltage of a floating-gate transistor can be raised by means of such electron injection, and the device is then assumes a first state that reflects the content of the memory cell. On the other hand, during erasure of the memory cell, electrons are expelled from the source 18 through the tunneling oxide layer 14 and out of the floating gate 10 of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e., more electrons than were previously injected. This results in the formation of electron holes in the floating gate of the device. In severe cases, the floating-gate transistor becomes a depletion transistor, which conducts even in the absence of the application of a control voltage at the control gate 12. This phenomena is known in the art as memory over-erasure.

To overcome the above described memory over-erasure problem of conventional EEPROM devices, a split-gate EEPROM device was proposed. FIG. 2a schematically shows such a split-gate device. The memory device comprises a floating-gate transistor, which similarly includes a floating gate 20 and a control gate 22, as is in the case of the floating-gate transistor of FIG. 1. However, the floating gate 20 only covers a portion of the channel region and the rest of the channel region is directly controlled by the control gate 22. This split-gate-based memory cell is equivalent to a series connected floating-gate transistor 33 and an enhanced isolation transistor 35, as is schematically represented in FIG. 2b. The principal advantage of such this configuration is obvious: the isolation transistor 35 is free from influence of the state of the floating gate 20 and remains in its off state, even if the floating-gate transistor 33 is subjected to the phenomena of over-erasure and therefore is in a conductive state. The memory cell can thus maintain its correct state, which reflects the correct state of the memory contents, in spite of over-erasure the problem.

However, the greatest drawback of such split-gate design is the fact that a reduced number of program/erase cycles are allowed. This reduction is due to the fact that the floating gate 20 of this split-gate memory cell configuration is only provided near the drain region 26, which results in different mechanisms occurring for the programming and erasing operations of the device. Electron passage must be via a sequence of drain 26 and through tunneling oxide layer 24, and the resulting reduction of allowable program/erase cycles renders the device suitable only for those applications requiring a relatively few number of program/erase cycles during the entire life span of the device.

SUMMARY OF THE INVENTION

It is therefore an object of the present invention to provide a flash EEPROM device having a split-gate memory cell which is modified to greatly increase of the number of allowable program/erase cycles.

It is another object of the present invention to provide a process of fabricating a flash EEPROM device having a split-gate memory cell structure which greatly increases the number of allowable program/erase cycles.

BRIEF DESCRIPTION OF THE DRAWING

Other objects, features and advantages of the present invention will become apparent by way of the following detailed description of the preferred but non-limiting embodiment, with reference to the accompanied drawings, wherein:

FIG. 2b is a schematic diagram showing the electrical equivalent of the memory cell of FIG. 2a;

DETAILED DESCRIPTION

Figure 3:
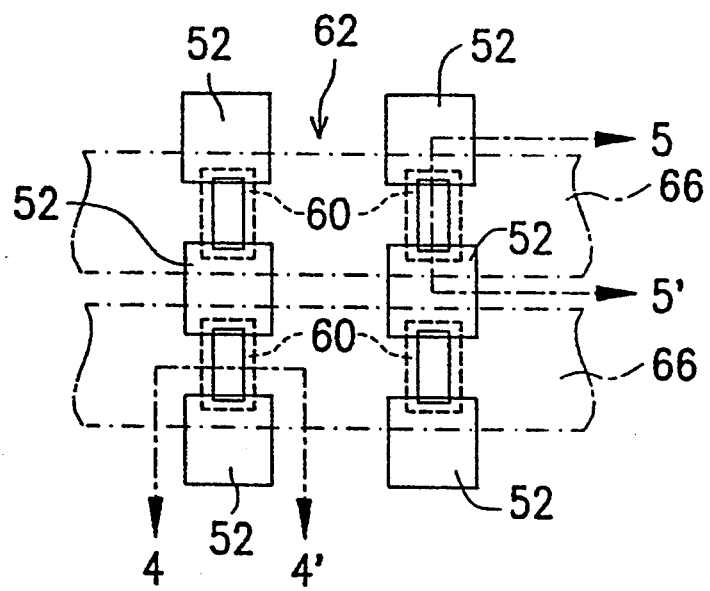
FIG. 3 is a diagram showing a split-gate flash memory IC device having separated tunneling regions in accordance with a preferred embodiment of the present invention.

The description of the present invention will be by means of exemplifying a preferred embodiment thereof. Reference will be made to FIG. 3, which is a diagram showing a split-gate flash memory IC device having separated tunneling regions in accordance with the preferred embodiment of the present invention. Attention should be directed simultaneously, together with the contents of FIG. 3, to the cross-sectional views taken along lines 4—4 and 5—5 as indicated in FIG. 3 and respectively shown in FIGS. 4a to 4d and FIGS. 5a to 5d during different stages of the manufacture of the memory device.

To fabricate a memory device in accordance with the teaching of the present invention, a silicon substrate 50 is provided. A process known as Local Oxidation of Silicon (LOCOS), which is a well known process which provides for partial oxidation of the silicon substrate to form insulating field oxide regions, is utilized to make a field oxide layer 52, as can be seen in FIGS. 3 and 5a, to isolate the component regions.

Figure 4A:
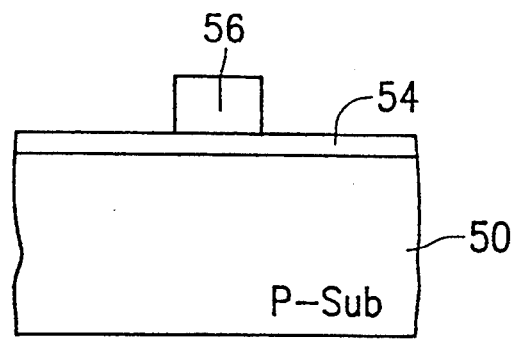
FIGS. 4a to 4d show a cross section taken along line 4—4 in FIG. 3 of a memory cell of a split-gate flash memory IC device in accordance with a preferred embodiment of the present invention at different stages during the fabrication process.
Figure 5A:
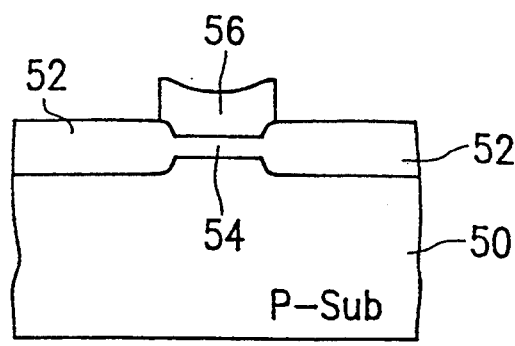
FIGS. 5a to 5d show a cross section taken along line 5—5' in FIG. 3 of a memory cell of a split-gate flash memory IC device of FIGS. 3 again at different stages during the fabrication process.

Referring now to FIGS. 4a and 5a, a gate oxide layer 54 with a thickness of, for example, 300Å, is then formed by a deposition or a thermal oxidation procedure. A nitride layer 56 is then deposited by a chemical vapor deposition (CVD) and a photoresist (not shown) is applied and then patterned before proceeding to etch away the nitride layer to leave the nitride islands shown in FIGS. 4A and to define a cover layer shielding the predetermined central control gate region. The exposed gate oxide layer 54 is then removed.

Figure 4B:
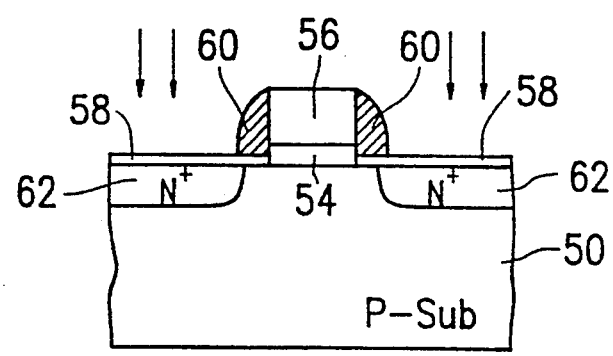
Figure 5B:
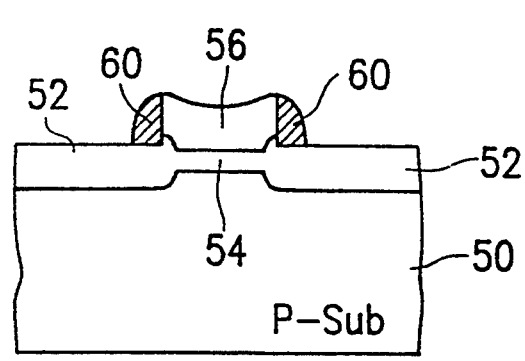

Turning now to FIGS. 4b and 5b, a thin tunneling oxide layer 58 is grown with a thickness of, for example, 100Å. A floating gate layer 60 is then deposited and doped with a suitable impurity, for example Phosphorus, implanted using ion implantation to a concentration of $1\times 10^{19}$ to $1\times 10^{21}$ cm$^{-3}$ the floating gate having a layer thickness of, for example, 4,000Å. After the floating gate layer is formed, it is subjected to an etching process so that it takes the shape of a conventional oxide spacer, but it is formed of polysilicon, as opposed to silicon dioxide. The resulting polysilicon gate structure 60 is spacer-shaped. Implantation next occurs to form the source and drain regions 62. This implantation process uses a suitable impurity, for example Arsenic ions (for an N- channel) with a concentration of $3\times 10^{15}$ atoms/cm$^2$ forming the configuration as shown in the cross-sectional views of FIGS. 4b and 5b along the two orthogonal directions defined in FIG. 3.

Figure 4C:
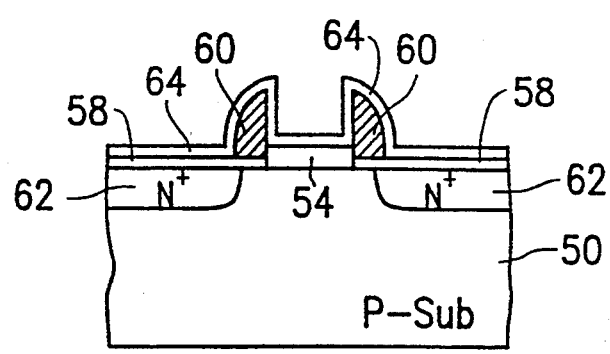
Figure 5C:
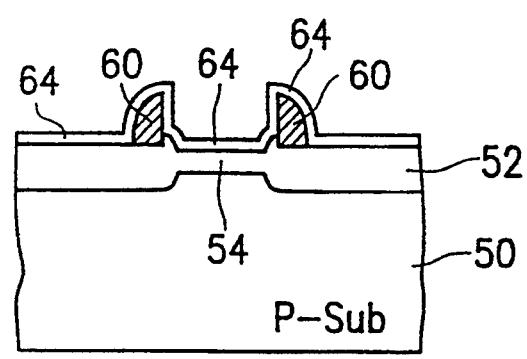

The reader's attention is now directed to FIGS. 4c and 5c. The nitride layer 56 is removed to define the configuration shown in these figures were a valley is defined in the middle of the floating gate 60. Thus, the floating gate 60 has an annular or ring shape, as can be seen most clearly in FIG. 3. An isolation dielectric layer 64 is formed on the gate regions. The isolation dielectric layer 64 can be of conventional NO (nitrideoxide) or ONO (oxide-nitride-oxide) and can be formed using conventional processing techniques well known to those skilled in the art.

Figure 4D:
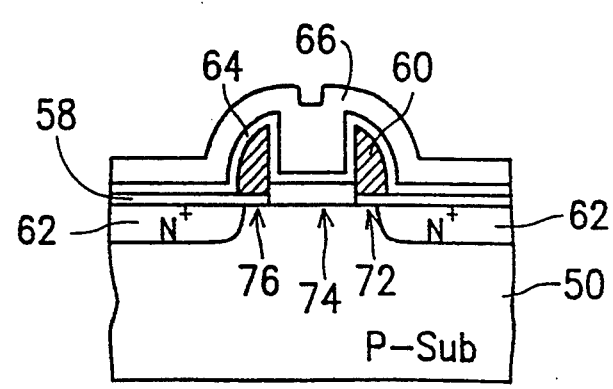
Figure 5D:
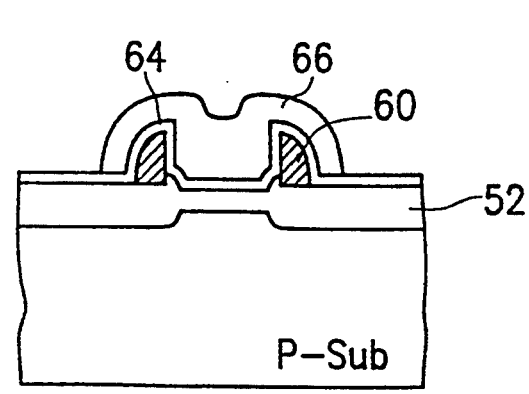

Referring now to FIGS. 4d and 5d, a control gate layer 66 is deposited and doped with a suitable impurity, for example Phosphorus implanted using ion implantation to a concentration of $1\times 10^{19}$ to $1\times 10^{21}$ cm$^{-3}$. A photoresist (not shown) is then applied and patterned and followed by an etching process to define a wordline control gate 66 (shown in FIGS. 3, 4d and 5d) for the subject flash memory device. The memory cell structure is now complete for the EEPROM IC device. The control gate is preferably of polysilicon which may be deposited by CVD.

Those skilled in the art will appreciate the fact that additional process steps will occur to complete the fabrication of a final EEPROM device wafer. Those additional steps, which do not concern the present invention, include such steps as the formation of a flattened BPSG protective layer, the formation of metal interconnections, and the formation of a top passivation layer.

Referring again to FIGS. 3, 4d and 5d, as can be seen clearly, the memory cell configuration as fabricated in accordance with the described process steps has a special floating-gate structure 60. Both its shape and process steps of construction are similar to that of a conventional spacer oxide layer, but here, instead of being a simple oxide layer, it forms a polysilicon gate structure. The gate structure 60 surrounds the channel region and thus takes an annular or ring shape. The fabrication process is relatively very simple, but is capable of achieving the desired results.

Figure 1:
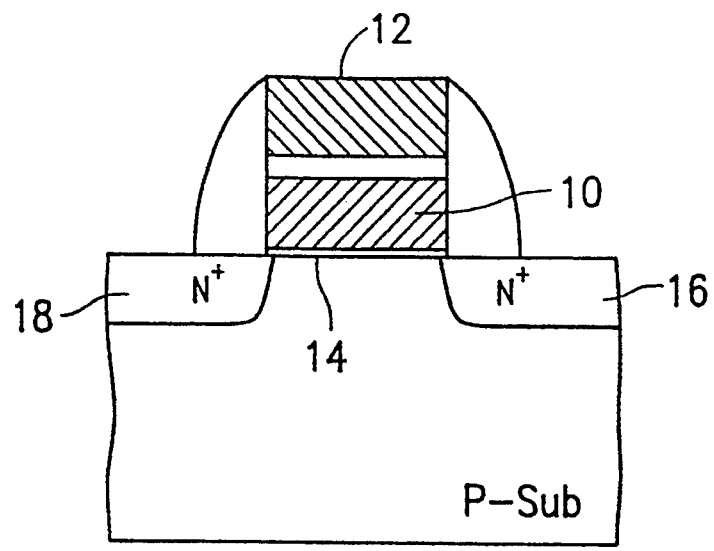
FIG. 1 is a diagram showing a cross section of the structure of a prior art floating-gate transistor for a EEPROM memory cell.
Figure 6:
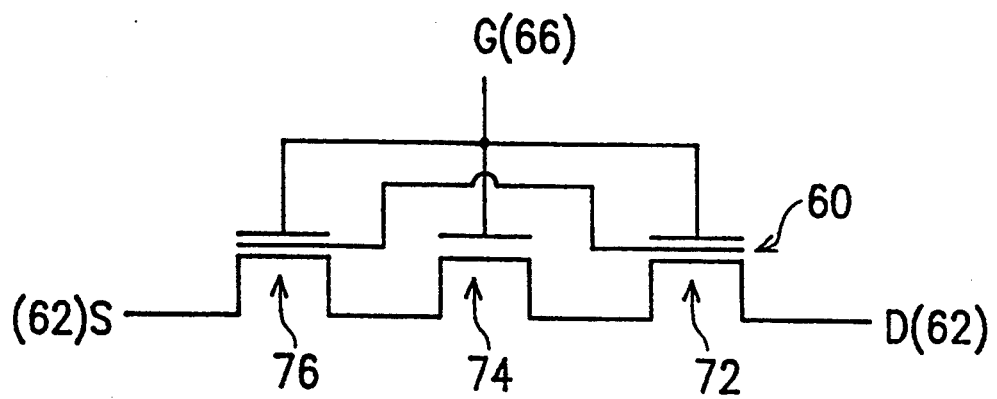
FIG. 6 is a schematic diagram showing an equivalent electrical circuit of the memory cell of a split-gate flash memory IC device as shown in FIGS. 4d and 5d.

In other words, the EEPROM memory cell configuration as shown in FIGS. 4d and 5d can be envisioned as a combination of an enhanced isolation transistor 74 with two floating-gate transistors 72 and 76, with all three transistors connected in series. An equivalent circuit showing the construction of the three series transistors is shown in FIG. 6. It is apparent from the circuitry that the memory cell configuration of the present invention is characterized with a separated gate structure, and is therefore capable of preventing the occurrence of over-erasure observed in prior art devices (such as the device of FIG. 1.)

Figure 2A:
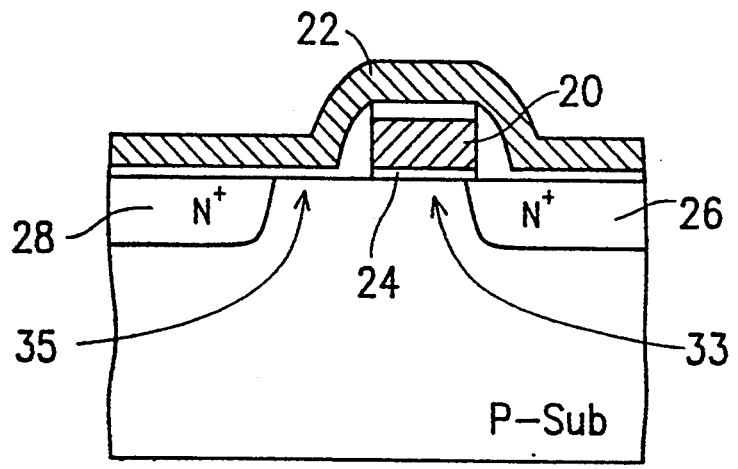
FIG. 2a is a diagram showing a cross section of the structure of a prior art split-gate EEPROM memory cell.
Figure 2B:
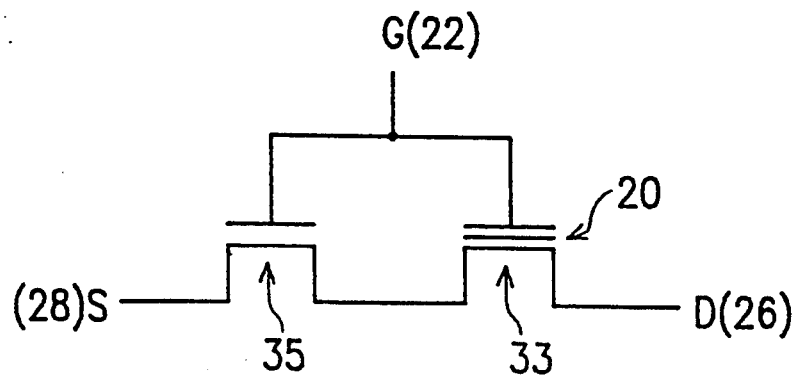

In addition, the memory cell configuration of the present invention, as shown in FIGS. 4d and 5d, is also freed of the severe limitation on the number of permitted program/erase cycles found in tile prior art split-gate configuration (such as the device of FIGS. 2a and 2b,) which relies on the single-sided program and erase operation from the drain region. More particularly, referring again to FIG. 6, the memory cell configuration of the present invention can utilize the drain region 62 (D) to inject electrons into the ring-shaped floating gate 60 via the tunneling oxide layer that is close to the drain region 62 (D) to facilitate the programming operation. When erasure is required, the source region 62 (S) can be utilized to expel electrons from the ring-shaped floating gate 60 via the tunneling oxide layer that is close to the source region 62 (S) to facilitate the erasure operation. Due to the configuration of separated tunneling regions, the number of possible program/erase cycles for a particular memory cell is greatly increased.

A comparison of the characteristics of a preferred embodiment of the present invention with that of a conventional EEPROM of the flash category is listed in Table 1 below. In the table, Vcg is the voltage applied to control gate, Vd is the voltage applied to the drain, Vs is the voltage applied to the source, Vpp is the programming voltage, and Vcc is the power source voltage.

TABLE 1

| Mode | Voltage | | |
|---|---|---|---|
| | Vcg | Vd | Vs |
| Programming | Vpp | 0V | Floating |
| Erasing | 0V | Floating | Vpp |
| Reading | Vcc | 1V | 0V |
| Vpp = 12 − 18 V | | | |

The fabrication processes necessary for implementing a flash EEPROM IC device in accordance with the disclosure of the present invention is fully compatible with that of conventional flash memory devices. The practical fabrication of devices in accordance with the teachings of the present invention is immediately possible. Moreover, tunneling oxide regions that are close to the source and drain regions, respectively, can self-align with the ring-shaped floating gates to form an accurate structural configuration.

Persons skilled in this art can appreciate the fact that the exemplified embodiment as employed in the above descriptive paragraphs has utilized a component of a $N^-$-type channel, which, obviously can be replaced with a $P^-$-type as well. In addition, all the described materials, conductance types, dimensions and process conditions are for the purpose of description, and not to limit the scope of the present invention, except as required by the claims. Modification will now suggest itself to those skilled in the art and therefore the presently disclosed invention should not be limited to the disclosed embodiments.

I claim:

1. A process for fabricating an electrically erasable and programmable read-only memory integrated circuit device having a split-gate memory cell with separated tunneling regions comprising the steps of:
   (a) providing a silicon substrate having a field oxide layer that isolates component regions;
   (b) forming a gate oxide layer on said silicon substrate;
   (c) depositing a nitride layer on said gate oxide layer;
   (d) etching away said nitride layer to form a nitride island;
   (e) removing exposed gate oxide layer;
   (f) growing a thin tunneling oxide layer to form tunneling regions on opposite sides of said nitride island;
   (g) depositing a floating gate layer and etching said floating gate layer to form a ring-shaped floating gate that surrounds the periphery of said nitride island;
   (h) implanting a source region and a drain region onto the surface of said silicon substrate, said source and drain regions not underlying said nitride island, said source and drain regions partially underlying said floating gate;
   (i) removing said nitride island to form a valley in the middle of said floating gate;
   (j) forming an isolation dielectric layer overlying said floating gate, said field oxide layer, said gate oxide layer, and said tunneling oxide layer;
   (k) depositing a control gate layer over a portion of said isolation dielectric layer, such that said control gate layer partially overlies said field oxide layer and said isolation dielectric layer, and such that said control gate layer completely overlies said source region, said drain region, said tunneling regions, and said floating gate; and
   (l) etching said control gate layer to form a word-line control gate 2. The process of claim 1 wherein said isolation dielectric layer has a nitride-oxide configuration.

3. The process of claim 1 wherein said isolation dielectric layer has an oxide-nitride-oxide configuration.

4. The process of claim 1 wherein said floating gate is polysilicon.

5. The process of claim 1 wherein a first of said tunneling regions that is closer to said drain region is utilized to program said device by allowing electrons to be injected from said drain through said first tunneling oxide layer and into said floating gate, and a second of said tunneling regions that is closer to said source region is utilized to erase said device by allowing electrons to be expelled from said floating gate through said second tunneling oxide layer and out of said source region.

6. The process as claimed in claim 1, wherein prior to step (a) said field oxide layer is formed by local oxidation of silicon.

7. The process as claimed in claim 1, wherein said gate oxide layer in step (b) is formed by a deposition procedure.

8. The process as claimed in claim 1, wherein said gate oxide layer in step (b) is formed by a thermal oxidation process.

9. The process as claimed in claim 1, wherein after step (c) and before step (d) a photoresist is applied to said nitride layer and patterned.

10. The process as claimed in claim 1, wherein, after depositing said floating gate layer in step (g) and before said etching of said floating gate layer in step (g), said floating gate layer is doped with an impurity to a concentration of $1 \times 10^{19}$ to $1 \times 10^{21}$ cm$^{-3}$.

11. The process as claimed in claim 10, wherein said impurity for doping said floating gate layer is implanted using ion implantation.

12. The process as claimed in claim 10, wherein said impurity for doping said floating gate layer is phosphorus.

13. The process as claimed in claim 1, wherein implanting said source and drain regions in step (h) is done by using a suitable impurity.

14. The process as claimed in claim 13, wherein said impurity for implanting said source and drain regions is arsenic ions with a concentration of $3 \times 10^{15}$ atoms/cm$^2$.

15. The process as claimed in claim 1, wherein, after step (k) and before step (l), said control gate layer is doped with an impurity to a concentration of $1 \times 10^{19}$ to $1 \times 10^{21}$ cm$^{-3}$.

16. The process as claimed in claim 15, wherein said impurity for doping said control gate layer is implanted using ion implantation.

17. The process as claimed in claim 15, wherein said impurity for doping said control gate layer is phosphorus.

18. The process as claimed in claim 1, wherein, after step (k) and before step (l), a photoresist is applied to said control gate layer and patterned.

19. The process as claimed in claim 1 wherein said control gate is polysilicon and wherein said control gate layer is deposited in step (k) by CVD.

20. The process as claimed in claim 1 wherein after step (l), a metal interconnection to connect a plurality of components is provided to form an electrically erasable and programmable read-only memory integrated circuit device having a split-gate memory cell with separated tunneling regions.

* * * * *